United States Patent
Ranganathan et al.

(10) Patent No.: US 11,448,609 B2
(45) Date of Patent: Sep. 20, 2022

(54) METHOD FOR OPERATING A GAS SENSOR ARRANGEMENT AND GAS SENSOR ARRANGEMENT

(71) Applicant: Sciosense B.V., AE Eindhoven (NL)

(72) Inventors: Rohit Ranganathan, Hyderabad (IN); Ravi Kumar Adusumalli, Secunderabad (IL)

(73) Assignee: SCIOSENSE B.V., AE Eindhoven (NL)

( * ) Notice: Subject to any disclaimer, the term of this patent is extended or adjusted under 35 U.S.C. 154(b) by 341 days.

(21) Appl. No.: 16/639,239

(22) PCT Filed: Jul. 18, 2018

(86) PCT No.: PCT/EP2018/069554
§ 371 (c)(1),
(2) Date: Feb. 14, 2020

(87) PCT Pub. No.: WO2019/037960
PCT Pub. Date: Feb. 28, 2019

(65) Prior Publication Data
US 2020/0240941 A1 Jul. 30, 2020

(30) Foreign Application Priority Data
Aug. 21, 2017 (EP) ................................. 17187089

(51) Int. Cl.
*G01N 27/12* (2006.01)
*H03M 1/52* (2006.01)

(52) U.S. Cl.
CPC ............ *G01N 27/122* (2013.01); *H03M 1/52* (2013.01)

(58) Field of Classification Search
CPC ..... H03M 1/52; G01N 27/122; G01N 27/045; G01N 27/028
See application file for complete search history.

(56) References Cited

U.S. PATENT DOCUMENTS

| | | | |
|---|---|---|---|
| 4,169,708 A | 10/1979 | Muggli | |
| 4,907,441 A * | 3/1990 | Shurmer | G01N 33/0031 73/31.05 |

(Continued)

FOREIGN PATENT DOCUMENTS

| | | |
|---|---|---|
| CN | 101292151 A | 10/2008 |
| CN | 102016557 A | 4/2011 |

(Continued)

OTHER PUBLICATIONS

Office Action issued in European Application No. 17187089.2, dated Mar. 13, 2020, 3 pages.

(Continued)

*Primary Examiner* — Lam T Mai
(74) *Attorney, Agent, or Firm* — Slater Matsil, LLP

(57) ABSTRACT

In an embodiment a method for operating a gas sensor arrangement includes generating a sensor current by a gas sensor, converting the sensor current into a digital comparator output signal in a charge balancing operation depending on a first clock signal, determining from the digital comparator output signal an asynchronous count comprising an integer number of counts depending on the first clock signal, determining from the digital comparator output signal a fractional time count depending on a second clock signal and calculating from the asynchronous count and from the fractional time count a digital output signal which is indicative of the sensor current generated by the gas sensor.

16 Claims, 2 Drawing Sheets

(56) References Cited

U.S. PATENT DOCUMENTS

| | | | |
|---|---|---|---|
| 4,994,807 A * | 2/1991 | Hobbs | H03M 1/60 |
| | | | 341/157 |
| 5,184,500 A | 2/1993 | Krcma et al. | |
| 6,642,500 B2 * | 11/2003 | Takahashi | H04N 3/155 |
| | | | 348/E3.018 |
| 6,750,796 B1 | 6/2004 | Holloway et al. | |
| 9,389,625 B2 | 7/2016 | Hu et al. | |
| 2002/0176067 A1 * | 11/2002 | Charbon | H04N 5/363 |
| | | | 348/E3.019 |
| 2004/0075140 A1 | 4/2004 | Baltes et al. | |
| 2007/0192041 A1 | 8/2007 | Goldstein et al. | |
| 2013/0120761 A1 | 5/2013 | Dyer et al. | |

FOREIGN PATENT DOCUMENTS

| | | |
|---|---|---|
| CN | 106464265 A | 2/2017 |
| EP | 0384858 | 8/1990 |
| EP | 3301437 | 4/2018 |
| EP | 3370340 | 9/2018 |
| JP | 2014-153352 | 8/2014 |

OTHER PUBLICATIONS

European Patent Office, International Search Report for PCT/EP2018/069554 dated Oct. 12, 2018.

Barrettino, D. et al.: "CMOS Monolithic Metal-Oxide Gas Sensor Microsystems" IEEE Sensors Journal vol. 6 No. Apr. 2, 2006, p. 276-285.

Lombardi, A. et al.: "A fully integrated interface circuit for 1.5oC accuracy temperature control and 130dB dynamic range readout of MOX gas sensors" IEEE Conference Oct. 2008, p. 78-81.

Paul, S. et al.: "A Fast Hardware Approach for Approximate, Efficient Logarithm and Antilogarithm Computations" IEEE Transactions on VLSI Systems. vol. 17, No. 2, Feb. 2009, p. 269-277.

Sins, C., "Sensor Analog Front End," National Semiconductor, China Academic Journal Electronic Publishing House, Mar. 31, 2011, 14 pages.

* cited by examiner

METHOD FOR OPERATING A GAS SENSOR ARRANGEMENT AND GAS SENSOR ARRANGEMENT

CROSS-REFERENCE TO RELATED APPLICATIONS

The present application is the national stage entry of International Patent Application No. PCT/EP2018/069554, filed on Jul. 18, 2018, which claims the benefit of priority of European Patent Application No. 17187089.2, filed on Aug. 21, 2017, all of which are hereby incorporated by reference in their entirety for all purposes.

BACKGROUND OF THE INVENTION

Gas sensors are used for air quality monitoring, safety or control, and other sensor applications. In resistive gas sensors a semiconductor material is exposed to a gas such that the electrical resistance in the sensor is decreased or increased when it comes in contact with the monitored gas. Dedicated measurement frontends are employed to evaluate an output signal of the sensor. The output signal may be a sensor current or voltage that is evaluated by a frontend to deduce the resistance or resistance change of the resistive gas sensor and, further, to determine the components included in a gaseous atmosphere. The measurement frontend is often affected by temperature drift and inaccuracies in process parameters such as a reference voltage, reference resistances and the like. Furthermore, accuracy and reliability of the sensor reading should be assured over a large measurement range including low and high resistances.

SUMMARY OF THE INVENTION

It is to be understood that any feature described hereinafter in relation to any one embodiment may be used alone, or in combination with other features described hereinafter, and may also be used in combination with one or more features of any other of the embodiments, or any combination of any other of the embodiments, unless explicitly described as an alternative. Furthermore, equivalents and modifications not described below may also be employed without departing from the scope of the method for operating a gas sensor arrangement and the gas sensor arrangement as defined in the accompanying claims.

The following relates an improved concept in the field of gas sensing. The improved concept provides means for implementing a gas sensor arrangement and a method for operating a gas sensor arrangement. The gas sensor arrangement may comprise a measurement frontend, e.g. implemented as a first order modulator or continuous time integrator that integrates between two known voltage thresholds. There may be a lower threshold and an upper threshold. Each time the modulator integrates until the upper threshold, a comparator triggers. The comparator trigger may subtract a pre-defined voltage that brings the output of the modulator to the lower threshold. Then the integrator starts integration over again.

The output of the integrator can be provided by an asynchronous output that is dependent on the magnitude of the sensor resistance, e.g. a signal current that is determined by a gas sensor resistance. The comparator may further trigger a counter which provides a count value. A slope of integration depends on the signal current and the count can be made a direct measure of current flowing through the gas sensor, and hence the sensor resistance for a fixed integration time.

Typically, several integration cycle can be conducted. A first integration cycle, however, may start from an uncertain starting voltage. To differentiate the first integration cycle from further cycles, a first count error may be accounted for. Furthermore, a last integration cycle may be terminated before completion of the finite integration time. An incomplete last integration cycle may be lead to an error termed as residue count error, which may be accounted for by a fractional count. For example, an output of a second counter can be used to measure a period of integration with a high-speed clock. In order to remove the error due to first-count error that may arise from improper initialization and, further, account for the residue signal that may not be included in the counter output, the integer count value can be complemented with the fractional count.

For example, the concept employs a resistive gas sensor with a series resistance of reference and sensor resistors. This allows for compressing a sensor current range with a (1/x) compression scheme. A ratiometric calculation approach reduces requirements for absolute accuracies of process parameters, drift with temperature and lifetime degradation.

In at least one embodiment a method for operating a gas sensor arrangement comprises the following steps. The method may be carried out by a measurement frontend equipped with a gas sensor, such as a resistive gas sensor, as discussed in further detail below.

First, a sensor current is generated by means of the gas sensor. The sensor current is converted into a digital comparator output signal in a charge balancing operation depending on a first clock signal. An asynchronous count is determined from the digital comparator output signal. The asynchronous count comprises an integer number of counts depending on the first clock signal. Additionally, a fractional time count is determined from the digital comparator output signal depending on a second clock signal. Finally, a digital output signal is calculated from the asynchronous count and from the fractional time count which is indicative of the sensor current generated by the gas sensor.

A resistance and/or resistance change can then be calculated from the digital output signal and an excitation voltage of the gas sensor, for example. In fact, the proposed concept is capable of interfacing with gas sensor such as a resistive gas-sensor, having a dynamic range from 1 kΩ to 1 GΩ, i.e. a 7-decade range. The proposed concept can be scaled or adapted for higher resistance ranges with programmable gain settings for single and multiple ranges. Calculation can be implemented by a ratiometric measurement and errors arising due to process parameters, such as $V_{force}$, $T_{int}$, $C_{ref}$, $V_{ref}$ and $R_{ref}$, and reference temperature drift tend to be cancelled. Inherently, the concept allows for detecting a sensor disconnection in the functional operation. Sensor excitation, e.g. by means of an excitation voltage can be constant. Finally, the concept can be implemented with low power and area requirements.

In at least one embodiment the sensor current is integrated into one or more reference charge packages for the duration of an integration time. The detection of a charge package determines an integration cycle. For example, charge is accumulated from a starting condition to an end condition. The charge accumulated in the process can be considered a charge package. The first clock signal is used to count a number of reference charge packages during the integration time. The asynchronous count is determined from the number of charge packages counted in terms of the first clock signal.

In at least one embodiment an integration cycle is determined from the time count by measuring adjacent counts in the asynchronous count in terms of the second clock signal. For example, the counts are measured in time periods and the time count is an indication of said time periods.

In at least one embodiment the time count is reset when a count has been determined.

In at least one embodiment a time period of a first integration cycle is determined as first integration period. The first integration period is determined by a first time stamp indicating the start of the first integration cycle and the second time stamp indicating a time of the first count in the asynchronous count.

In at least one embodiment the time period of one or more complete integration periods is determined as complete integration period. For example, a complete integration period can be considered any time period between two adjacent counts in the asynchronous count. For example, the complete integration period is determined by a third time stamp indicating a count in the asynchronous count and a fourth time stamp indicating an adjacent count in the asynchronous count.

In at least one embodiment more than a single complete integration period is determined. An average complete integration period is determined from the determined complete integration periods.

In at least one embodiment a time period between the last complete integration cycle and an end of the integration is determined as residual time period. The residual integration period is determined by a time stamp indicating the last count in the asynchronous count and a time stamp indicating the end of the integration, i.e. when signal acquisition is terminated as the integration time has run through.

In at least one embodiment a first count error is accounted for by calculating a first fractional count. The first fractional count is based on the first integration period and the complete integration period. The first fractional count is a measure of the sensor current generated by the gas sensor during the first integration cycle.

In at least one embodiment a residual count error is accounted for by calculating a second fractional count. The second fractional count is based on the last integration period, the complete integration period and the residual time period. The complete integration period can be any period indicating the time of a complete integration cycle. For example, the complete integration period refers to the period of the last complete integration cycle. The second fractional count is a measure of the sensor current generated by the gas sensor during the last integration cycle.

In at least one embodiment the digital comparator output signal is generated by means of a latched the comparator. A comparator latch synchronization error is accounted for by calculating an average integration period of more than a single complete integration period. The average integration period is a measure of a modulation in the digital comparator output signal introduced by the latched comparator.

In at least one embodiment the average integration period is used instead of a single complete integration period, e.g. the last complete integration period. The average integration period is used for correcting the first count error, residual count error, and/or comparator latch synchronization error.

In at least one embodiment the digital output signal includes a sum based on the asynchronous count and the first and second fractional counts, based on one or more complete integration periods and/or the average integration period.

In at least one embodiment the gas sensor comprises at least one reference resistor and a sensor resistor having a reference resistance $R_{ref}$ and the sensor resistance $R_{sensor}$, respectively. Furthermore, the method is carried out in a sensor phase and a reference phase of operation. In the sensor phase, the gas sensor generates the sensor current depending on the combined resistance value of reference resistance $R_{ref}$ and sensor resistance $R_{sensor}$. The digital output signal of the sensor phase is indicative of the sensor current generated by the gas sensor in the sensor phase. In the reference phase, the gas sensor generates the sensor current depending on the at least one reference resistance $R_{ref}$. The digital output signal of the reference phase is indicative of the sensor current generated by the gas sensor in the reference phase.

For example, the reference resistor and a sensor resistor are connected in series and can be switched such that the sensor current is determined by the combined resistance value of reference resistance $R_{ref}$ and sensor resistance $R_{sensor}$ or defined by the reference resistance $R_{ref}$. Furthermore, it is also possible to provide more than a single reference resistors. More reference resistor can be connected in series and switches can be provided to selectively apply their combined resistances to affect the sensor current. This way several measurement ranges can be implemented.

In at least one embodiment the integration time $T_{int,r}$ for the reference phase and the integration time $T_{int,s}$ for the sensor phase can be chosen indepently from each other. The integration times may be the same in value or differ from each other. The actual values can be chosen in view of system optimization.

In at least one embodiment a gas sensor arrangement comprises an analog-to-digital converter arrangement and a signal processing unit. The analog-to-digital converter arrangement comprises a sensor input for connecting a gas sensor and a result output for providing a digital comparator output signal. The signal processing unit is connected to the result output of the analog-to-digital converter.

During operation the analog-to-digital converter performs a charge balancing operation depending on a first clock signal.

The analog-to-digital converter is adapted to convert a sensor current generated by the gas sensor into the digital comparator output signal. The signal processing unit is adapted to determine from the digital comparator output signal a digital output signal comprising an asynchronous count and a fractional time count. The asynchronous count comprises an integer number of counts depending on the first clock signal. The fractional time count depends on a second clock signal. The digital output signal is indicative of the sensor current generated by the gas sensor.

In at least one embodiment the signal processing unit comprises a first counter, a second counter, and a logic/calculation engine. The first counter has a first clock input connected to the result output and comprising a first reset input. The second counter comprises a second clock input and the second reset input. The logic/calculation engine comprises a calculation input connected to a first counter output of the first counter and to a second counter output of the second counter, respectively.

During operation the first counter receives the first clock signal at the first clock input and generates the asynchronous counts depending on the first clock signal. The second counter receives the second clock signal at the second clock input and generates the time count depending on the second clock signal. Finally, the logic/calculation engine receives the asynchronous count and the time count recalculates the digital output signal from the asynchronous count and the time count.

In at least one embodiment the gas sensor comprises at least one reference resistor and a sensor resistor having a reference resistance $R_{ref}$ and the sensor resistance $R_{sensor}$, respectively. In the sensor phase, the gas sensor is arranged to generate the sensor current depending on the combined resistance value of reference resistance $R_{ref}$ and sensor resistance $R_{sensor}$. In a reference phase, the gas sensor is arranged to generate the sensor current depending on the at least one reference resistance $R_{ref}$.

In at least one embodiment the analog-to-digital converter arrangement comprises a latched comparator providing the digital comparator output signal. Furthermore, the signal processing unit is adapted to determine an average integration period to correct for a modulation in the digital comparator output signal.

Further implementations of the gas sensor arrangement are readily derived from the various implementations and embodiments of the method for operating a gas sensor arrangement and vice versa.

In the following, the principle presented above is described in further detail with respect to drawings, in which exemplary embodiments are presented.

In the exemplary embodiments and Figures below, similar or identical elements may each be provided with the same reference numerals. The elements illustrated in the drawings and their size relationships among one another, however, should not be regarded as true to scale. Rather individual elements, such as layers, components, and regions, may be exaggerated to enable better illustration or improved understanding.

DETAILED DESCRIPTION

Figure 1:
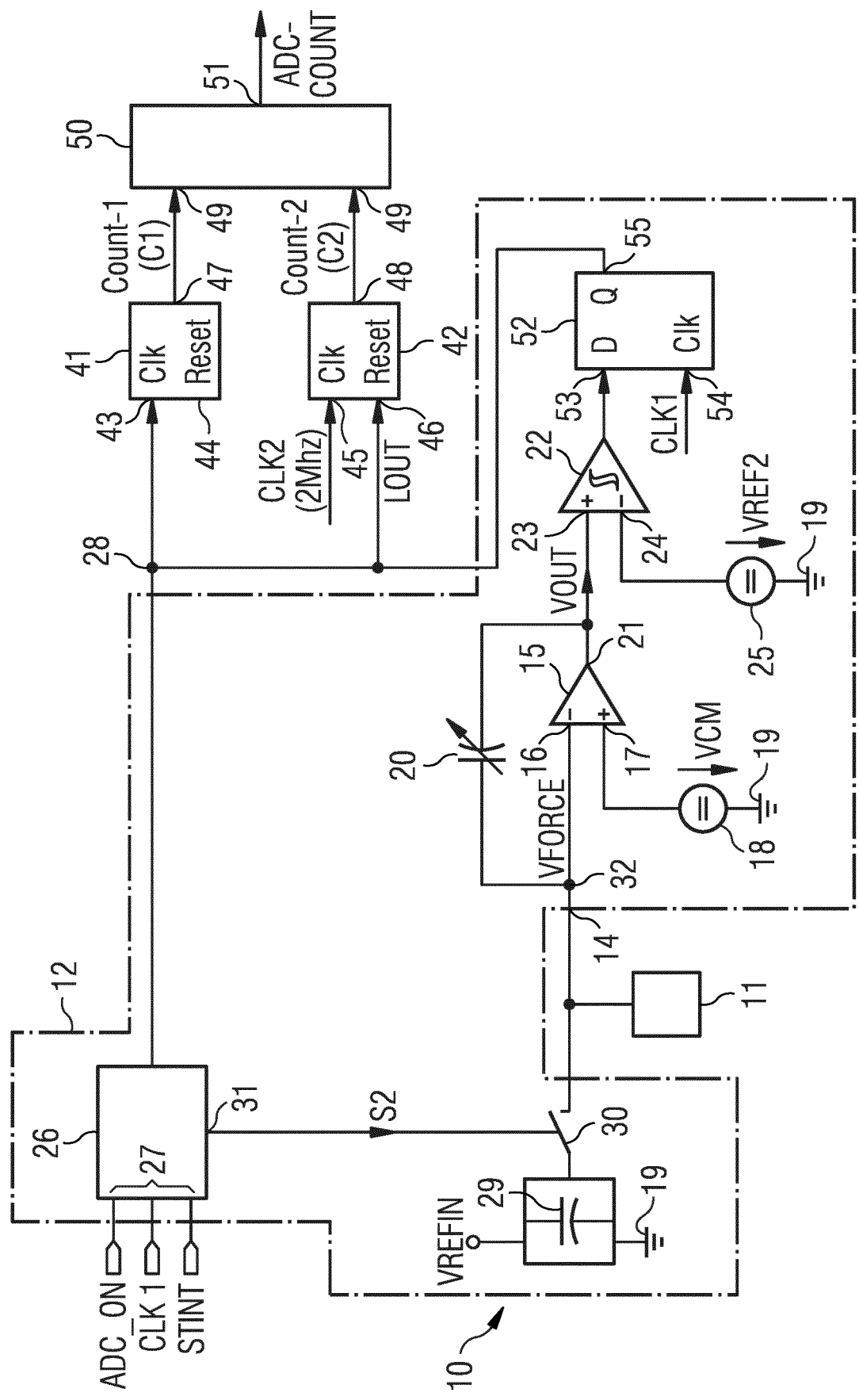
FIG. 1 shows an embodiment of a gas sensor arrangement.

FIG. 1 shows an embodiment of a gas sensor arrangement 10. The gas sensor arrangement 10 comprises a gas sensor 11 and an analog-to-digital converter arrangement 12, abbreviated as converter hereinafter. Furthermore, the gas sensor arrangement 10 comprises a signal processing unit 40. The converter 12 and the signal processing unit 40 are combined into the gas sensor arrangement 10 which may be designed as an integrated circuit. The gas sensor 11 can be connected to the integrated circuit as an external component or may be integrated into the integrated circuit. In this embodiment the gas sensor 11 is a resistive gas sensor comprising a material that changes its electrical resistance in response to changes in a gas in contact with the sensor material.

The gas sensor 11 is connected to an input 14 of the converter 12. The converter 12 comprises an amplifier 15 having an amplifier input 16 connected to the input 14 of the converter 12. In this embodiment the amplifier input 16 is implemented as an inverting input. The amplifier 15 comprises a further amplifier input 17 that is designed as a non-inverting input, for example. The gas sensor 11 connects the input 14 of the converter arrangement 12 to a reference potential terminal 19. A first bias source 18 couples the further amplifier input 17 to the reference potential terminal 19. An integrating capacitor 20 of the converter 12 connects the amplifier input 16 to an amplifier output 21 of the amplifier 15.

The converter 12 comprises a comparator 22 having a comparator input 23 which is connected to the amplifier output 21. The comparator input 23 is implemented as a non-inverting input, for example. A further comparator input 24 of the comparator 22 is designed as an inverting input, for example. A reference voltage source 25 connects the further comparator input 24 to the reference potential terminal 19. An output of the comparator 22 is connected to a digital control circuit 26. The digital control circuit 26 comprises a control input 27 and control logic as well as one or more clock generators.

Furthermore, the converter 12 comprises a reference capacitor 29. The reference capacitor 29 is coupled via a reference switch 30 of the converter arrangement 12 to the input 14 of the converter 12. Thus, the reference capacitor 29 is coupled to the amplifier input 16 by means of the reference switch 30. A control output 31 of the digital control circuit 26 is connected to a control terminal of the reference switch 30. The first bias source 18 is coupled to the reference capacitor 29.

Furthermore, the comparator 22 can be implemented as a latched comparator. Comparator 22 has an output which is connected to a first latch input 53 of a latch 52. The latch 52 comprises a second latch input 54 to receive the first clock signal CLK1. A latch output 55 is connected to the result output 28 of the converter 12 and to the digital control circuit 26.

The signal processing unit 40 is connected to a result output 28 of the converter 12. The signal processing unit 40 further comprises a first counter 41, a second counter 42 and a logic/calculation engine 50. The first counter 41 has a first clock input 43 which is connected to the result output 28. Furthermore, the first counter 41 has a first reset input 44. Similarly, the second counter 42 has a second clock input 45 and a second reset input 46. A first counter output 47 of the first counter 41 and a second counter output 48 of the second counter 42 are each connected to a calculation input 49 of the logic/calculation engine 50. Finally, the logic/calculation engine 50 comprises a calculation output 51. The signal processing unit 40 can, at least in parts, be implemented as a microcontroller.

Sensor signal acquisition is initialized by applying an input control signal ADC_ON and an integration time signal STINT to the control input 27 of the digital control circuit 26. Additionally, a first clock signal CLK1 can be provided to the control input 27. The first clock signal CLK1 can be provided by a clock generator (not shown) and/or be generated by the digital control circuit 26. For example, the gas sensor arrangement 10 is cleared before signal acquisition proceeds. As the input control signal ADC_ON is provided to the control input 27 operation of the converter 12 is triggered. The first bias source 18 provides at a reference terminal VREFIN an amplifier reference voltage, e.g. a common mode voltage VCM, to the reference capacitor 29. The reference capacitor 29 generates a charge package QREF. The charge package QREF has a value according to $$Q_{ref} = V_{ref,in} \cdot C_{ref},$$

wherein $C_{ref}$ is a capacitance value of the reference capacitor 29 and $V_{ref,in}$ is a voltage value of the amplifier reference voltage. By generating the charge package QREF the gas sensor 11 is excited with a known excitation voltage VFORCE which is constant throughout signal acquisition.

The digital control circuit 26 provides a reference switch signal S2 to the reference switch 30. The reference switch signal S2 opens or closes the reference switch 30. After closing the reference switch 30, the charge package QREF is applied to the integration node 32. Furthermore, the first and second counters 41, 42 are reset by applying a reset signal SRESET to the first and second reset inputs 44, 46, respectively. The reset signal SRESET may be issued by means of the digital control circuit 26, for example.

Depending on the input control signal ADC_ON, and after the gas sensor arrangement 10 has been set or cleared to an initial condition, signal acquisition is started and the gas sensor 11 generates a sensor current IR. The value of that current depends on the resistance of the gas sensor 11 which is influenced by the gas in contact with the sensor material. The sensor current IR is applied to input 14 of the converter 12. The gas sensor 11, the amplifier input 16 and the integrating capacitor 20 are each connected to the integration node 32. Also the reference capacitor 29 is coupled to the integration node 32 via the reference switch 30. Thus, the sensor current IR flows from the integration node 32 to the reference potential terminal 19 with a positive value. An input voltage VFORCE is tapped at the amplifier input 16 and, thus, also at the integration node 32. The input voltage corresponds to the excitation voltage. The first bias source 18 provides a common mode voltage VCM to the further amplifier input 17. An amplifier reference voltage Vref1 is determined by the reference voltage Vref,in and a ratio of capacitances of the capacitors 20, 29, e.g. Vref1=Cref/Cint·Vref,in. The amplifier 15 generates an output voltage VOUT at the amplifier output 21.

In case the reference switch 30 is open, the sensor current IR is integrated on the integrating capacitor 20. The output voltage VOUT rises as a function of time t as $$V_{OUT} = \frac{I_R \cdot t}{C_{INT}},$$

wherein $I_R$ is a value of the sensor current and $C_{INT}$ denotes a capacitance value of the integrating capacitor 20.

The output voltage VOUT of the amplifier 15 is applied to the comparator input 23. The reference voltage source 25 generates a bias voltage VREF2 which then is applied as a comparator reference to the further comparator input 24. For example, the amplifier reference voltage Vref1 and the comparator reference voltage Vref2 constitute a lower threshold and an upper threshold for signal acquisition using the measurement frontend. The comparator 22 generates a comparator output signal LOUT depending on the values of the output signal VOUT and of the comparator reference voltage VREF2. The comparator output signal LOUT has a first logical value if the output voltage VOUT is larger than the comparator reference voltage VREF2 and has a second logical value if the output voltage VOUT is smaller than the comparator reference voltage VREF2. The comparator output signal LOUT is provided to the digital control circuit 26.

In case a latch is implemented the comparator 22 and latch 52 can be operated as a latched comparator. The latch 52 outputs the comparator output signal LOUT only at certain instances which are defined by the first clock signal CLK1. Due to the first clock signal CLK1 the latched comparator is only comparing the output voltage VOUT of amplifier 15 with the bias voltage VREF2 at certain intervals of the CLK1.

During signal acquisition the signal processing unit 40 counts pulses of the comparator output signal LOUT. Basically, the counting is done by the first counter 41. Together the converter 12 and the first counter 41 can be considered a first order modulator that generates an asynchronous count COUNT-1, or abbreviated as C1 hereinafter. The asynchronous count C1 is directly proportional to the sensor current IR that is integrated on the integrating capacitor 20. However, this is only true within an error margin. As will be discussed in more detail with respect to FIG. 2 the asynchronous count C1 is prone to error which is accounted for by the signal processing unit 40. The first counter 41 provides the asynchronous count C1. This count, however, only comprises an integer number of individual counts.

The second counter 42 can be considered a free running counter operating on a second clock signal CLK2 received at the second clock input 45. The second clock signal CLK2 can be provided by a clock generator (not shown) and/or by the digital control circuit 26. The second counter 42 is reset by receiving the comparator output signal LOUT at the second reset input 46. The second counter 42 generates a time count COUNT-2, or abbreviated as C2 hereinafter, that resolves a time period between adjacent periods or time intervals of the asynchronous count C1. For example, the second clock signal CLK2 is implemented with a higher frequency when compared with the first clock signal CLK2. For example, the first clock signal CLK1 has a rectangular function with a frequency of 737 kHz and the second clock signal CLK2 has a rectangular function with a frequency of 2 MHz.

The logic/calculation engine 50 receives both the asynchronous count C1 and the time count C2 at the calculation input 49. The logic/calculation engine 50 uses both these counts C1 and C2 to generate a fractional count C-ERROR, abbreviated as CE hereinafter, that can be used to account for various errors. Further details will be discussed below with respect to FIG. 2. Finally, the logic/calculation engine 50 provides a digital output signal ADC-COUNT which accounts for the errors mentioned above and which, to a higher degree of accuracy, is proportional to the measured sensor current IR. In other words, the logic/calculation engine 50 generates a digital output signal ADC-COUNT which can be represented as

ADC-COUNT=C1+CE=C1+CE(C1,C2), wherein the term CE(C1,C2) indicates that a fractional count CE is a function of both counts C1 and C2.

The digital control circuit 26 not only initializes but also terminates signal acquisition after the integration time has run through. The integration time is set at the digital control circuit 26 depending on the integration time signal STINT.

Figure 2:
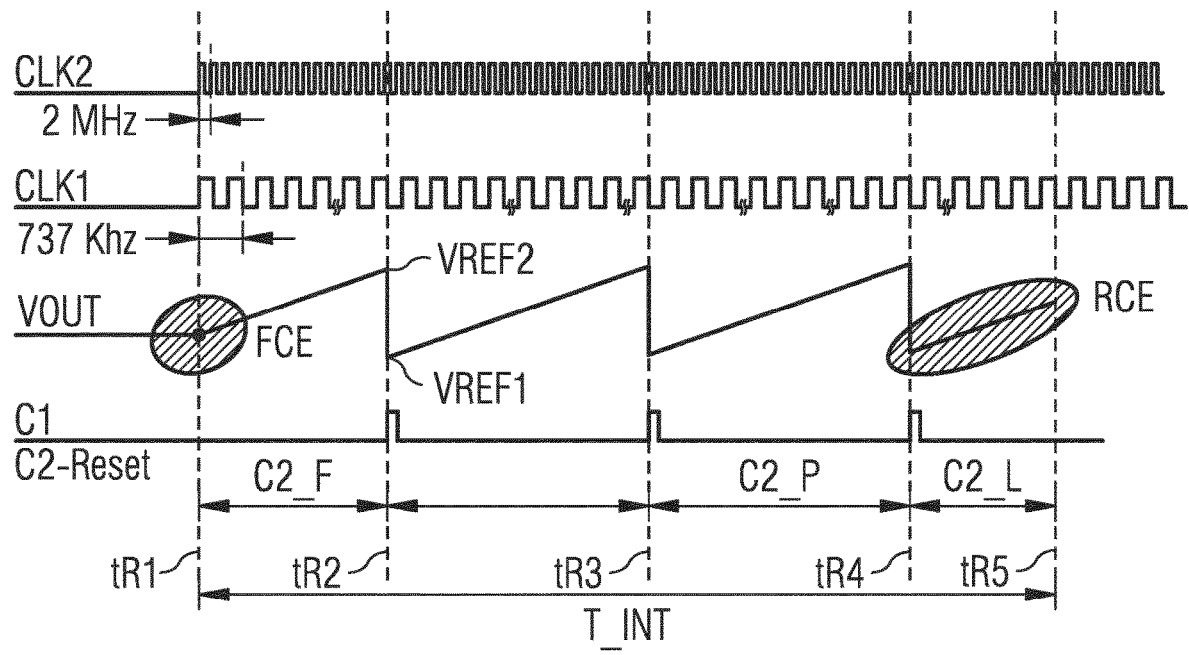
FIG. 2 shows a timing diagram of signals of the embodiment of a gas sensor arrangement according to FIG. 1.

FIG. 2 shows a timing diagram of signals of the embodiment of a gas sensor arrangement according to FIG. 1. The drawing shows the different signals and operation of the gas sensor arrangement 11. Depicted are the first clock signal CLK1 and the second clock signal CLK2. The clock signals are implemented as rectangular functions having a frequency of 737 kHz and 2 MHz, respectively. These values should be considered as examples only and are not restricted to these exact values. Typically the frequency of the first clock signal CLK1 is chosen to be lower than the frequency of the second clock signal CLK2. Furthermore, the drawing shows the output voltage VOUT of the amplifier 15. Finally, FIG. 2 shows the asynchronous count C1 and the time count C2. The signals are represented as functions of time t. As signal acquisition proceeds for a certain integration time TINT the integration time is shown as a means of reference.

The basic principle of operation relies on the concept of a charge-balancing converter. The converter 12 collects sensor current IR which by several steps is converted into counts. Ideally the number of counts C1 measured during the integration time TINT is a direct measure of the sensor current IR. The resulting asynchronous count C1 is complemented with various error estimates which can be derived from the time count C2.

The basic operation principle is implemented by the various components of the gas sensor arrangement as discussed in FIG. 1. The converter 12 is designed as a charge-balancing converter and used to convert the sensor current IR to a digital count in the form of the digital output signal ADC-COUNT. The sensor current IR is integrated at the integration node 32 and the integration capacitor 20 generates the input voltage VFORCE. If the charge integrated into the integration capacitor 20 is larger than a unit charge packet QREF the charge on the integration capacitor 20 will be decreased by one unit charge packet and the counter 40 will be incremented by one logical value. The integration time signal STINT determines an integration time TINT. By integrating the sensor current IR during the integration time TINT, the asynchronous count C1 yields a measure of sensor current generated by the gas sensor 11. The integration time TINT may be 100 ms for example. The integration time TINT can be a multiple of a period of the first clock signal CLK1. In this embodiment the comparator reference voltage is constant and its value is determined by the bias voltage VREF2.

An exemplary measurement cycle may involve the following steps. Initially, when the input control signal ADC_ON is low, the converter 12 is reset. Resetting the converter 12 may involve clearing the gas sensor 11 as well; and clearing the integration capacitor 20. The output of the amplifier VOUT is reset to a pre-defined voltage lower than VREF. For example, the value of this pre-defined voltage is determined based on the gain setting of the measurement frontend.

As a consequence the comparator output signal LOUT is low. The reference capacitor 29 is charged with the charge package QREF and disconnected from the integration node 32. The first and second counters 41, 42 are cleared so that the digital output signal at the calculation output 51 is 0. The second reference switch signal S2 applied to the reference switch 30 is low.

After the converter is reset, signal acquisition can be initialized by setting the input control signal ADC_ON from low to high. The integration time signal STINT transits from low to high at the same time the converter 12 starts operation. The gas sensor 11 is excited with the excitation voltage VFORCE and the sensor current IR is generated. Said current is integrated by the integrator which is formed by the amplifier 15 and integrating capacitor 20. The sensor current IR is integrated at the integration node 32 and the output voltage VOUT is ramping up during integration. The comparator 22 monitors the output voltage VOUT of the integrator that is the output voltage VOUT of the amplifier 15. When the output voltage VOUT is larger than the comparator reference voltage, the comparator output signal LOUT is high and a charge packet $Qref = V_{ref,in} \cdot C_{ref}$ is dumped into the integration node 32. The output signal LOUT is received at the first counter 41 and the asynchronous count C1 is incremented by one count.

After the charge dumping the output voltage VOUT is reduced by the value $V_{ref,in} \cdot C_{ref}/C_{int}$. The output voltage VOUT returns back to low, i.e. to the pre-defined voltage lower than VREF mentioned above, and is lower than the comparator reference voltage and ramps up back again. The charge packet circuit 29 is disconnected from the integration node 32 and back to a recharging mode. A number N of dumpings is increased by one count. The output voltage VOUT swings between the amplifier reference voltage VREF1 and the comparator reference voltage VREF2. This process is characterized by a charge dumping period CDP and will repeat until the integration time TINT is lapsed and the signal STINT transits from high to low. During the integration time TINT, the signal STINT is high, the number counts are accumulated by the first counter 41. The counter value C1 is equal to the number N of dumpings and provides a first measure of the sensor current IR. The asynchronous count C1 is equal to the number N of dumpings counted by the first counter 41, i.e. the number N of charge dumpings is equal to the counts of the first counter 41 of the converter 12 generated over the period defined by the integration time TINT. However, the asynchronous count C1 may not be directly proportional to the sensor current IR. A number of sources of error may affect the accuracy of conversion of sensor current IR into a digital count in the form of the digital output signal ADC-COUNT. FIG. 2 illustrates two sources from which an error may originate.

At the end of signal integration the integration time signal STINT transits from high to low. This causes the output voltage VOUT to interrupt a ramp up to a value less than the comparator reference voltage. The information of the incomplete integration is not included into the asynchronous count C1 and, thus, is not included into the digital output signal ADC-COUNT if no additional steps are taken. A residual charge QRES remains after integration time is terminated. In other words the last incomplete integration cycle of the converter 12 introduces a measurement error in the asynchronous count C1. As the count value reduces, the magnitude of the error increases more and more. This may prevent getting an accurate measurement from low count values, for example. This error will be referred to as residual count error RCE hereinafter.

Another source of error may be due to incomplete initialization of the converter during reset. The integration of the first cycle does not always start from a desired value. This uncertainty may introduce a measurement error in the asynchronous count C1 as well. Especially if accurate information is sought it may be beneficial to correct for this effect, hereinafter referred to as first count error FCE.

The various errors can be accounted for by generating fractional counts. A fractional count lies between 0 and 1 as it does not qualify for a full integer count. In fact, full counts are added to the asynchronous count C1. The fractional counts can be determined by using the second counter 42. The second counter 42 receives the second clock signal CLK2 at the second clock input 45. The time count C2 is reset via the second reset input 46 every time a full charge dumping period CDP is completed. The second counter 42 resolves a period between adjacent counts in the asynchronous count C1. In other words every time an integration cycle is completed and a charge is dumped the number N of dumpings is increased by one count in the asynchronous count C1 by the first counter 41. The second counter 42 generates the time count C2 which is a digital value that determines a time period or duration for the respective integration cycle.

The last integration cycle starts at a certain time stamp tR4 which is defined by generating a count in the asynchronous count C1 (see circle C1 in the drawing). The integration cycle starts over again by resetting the converter 12 as discussed above. However, in this case the integration terminates before another complete charge dumping period CDP has been completed. This can be characterized by another time stamp tR5. The difference between the two time stamps defines a residual time period C2_L in the time count C2. The residual time period C2_L is determined by the second count C2 as a function of the second clock signal CLK2. The residual time period C2_L is provided to the calculation input 49 of the logic/calculation engine 50.

Furthermore, the second counter 42 determines one or more complete integration periods C2_P which is defined by consecutive time stamps tR3, tR4 indicating consecutive counts in the asynchronous count C1. The difference between the two consecutive time stamps defines the complete integration periods C2_P in the time count C2. The complete integration periods C2_P is determined by the second counter C2 as a function of the second clock signal CLK2.

Similarly, a start time stamp tR1 can be defined as the moment the first integration is initialized, e.g. by means of the input control signal ADC_ON. The first integration cycle may terminate by charge dumping before a full charge dumping period CDP is completed (see circle C2 in the drawing). The moment this first integration cycle is completed can be characterized by another time stamp tR2. The difference between the first two consecutive time stamps tR1, tR2 defines a first integration period C2_F in the time count C2. The first integration period C2_F is determined by the second counter C2 as a function of the second clock signal CLK2.

The first integration period C2_F, the one or more complete integration periods C2_P and the residual time period C2_L are provided to the logic/calculation engine 50. The logic/calculation engine 50 comprises means such as control logic or a microcontroller to hold the time count C2 including the characteristic periods C2_F, C2_P and C2_L and to calculate error estimates from the time count C2.

The residual count error RCE is corrected by calculating a residual signal estimate and adding the result to the asynchronous count C1 of the first counter 41. The residual signal estimate can be approximated as the residual time period C2_L divided by the complete integration period C2_P. Thus, the digital output signal ADC-COUNT can be corrected for the residual count error RCE and yields the value $$ADC-COUNT = C1 + \frac{C2\_L}{C2\_P},$$

wherein C1, C2_L, C2_P are values of the asynchronous count C1, residual time period C2_L and the complete integration period C2_P, respectively. The complete integration period C2_P can be any time period of a complete integration cycle such as the last one, for example. The complete integration period C2_P can exchanged with an average integration period C2_A.

The first count error FCE can be accounted for calculating another fractional count based on the first integration period C2_F and the complete integration period C2_P determined by the logic/calculation engine 50. A first count error estimate follows from the fact that integration by means of the converter can be approximated as linear for a given sensor current IR. Consequently, a sum of the two incomplete periods C2_L and C2_F can be corrected by one complete integration period C2_P to yield $$ADC-COUNT = C1 + \frac{C2\_F - C2\_P}{C2\_P}.$$

Again the complete integration period C2_P can be any time period of a complete integration cycle such as the last one, for example. The complete integration period C2_P can exchanged with an average integration period C2_A.

The estimates of the residual count error RCE and the first count error FCE can be used to the digital output signal ADC-COUNT that accounts for both sources of error. Then the digital output signal ADC-COUNT is given by $$ADC-COUNT = (C1 - 1) + \frac{C2\_L + C2\_F}{C2\_P}.$$

The complete integration period C2_P can be determined as the last complete integration period C2_P before the integration time is run out and the measurement is terminated. However, any complete integration period of complete integration cycles in-between the first integration period C2_F and the residual time period C2_L can be used to determine the last complete integration period C2_P.

In an alternative, more than one or all complete integration periods can be used to determine an average integration period C2_A. In this case the logic/calculation engine 50 is designed to determine more than one or all complete integration periods and is arranged to calculate the average complete integration period C2_P. The average integration period C2_A is then defined as complete integration period C2_P for calculating the error estimates. Thus, $$ADC-COUNT = (C1 - 1) + \frac{C2\_L + C2\_F}{C2\_A}.$$

Figure 3:
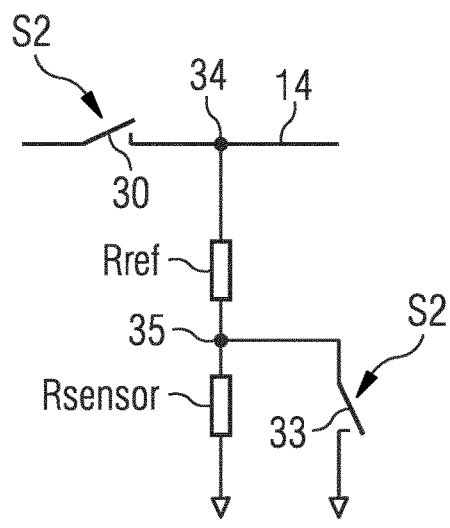
FIG. 3 shows an embodiment of a gas sensor.
Figure 4:
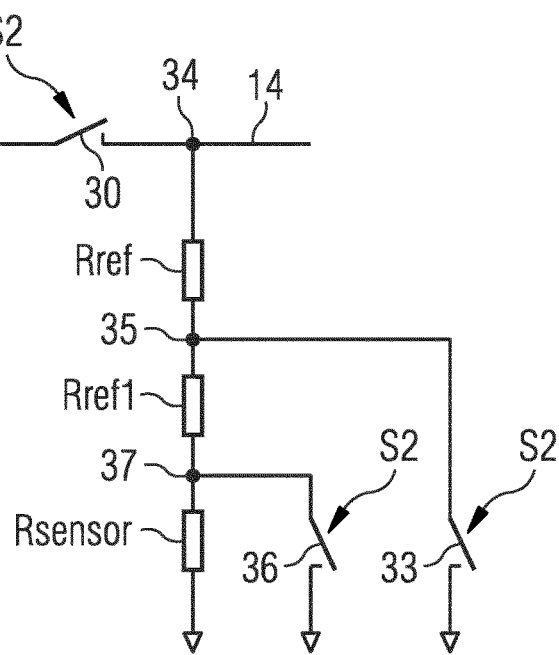
FIG. 4 shows another embodiment of a gas sensor.

FIG. 3 shows an embodiment of a resistive gas sensor. The gas sensor is represented as a sensor resistor Rsensor and a reference resistor Rref which are connected in series and connected to circuit node 34. Said circuit node is connected to input 14 and reference switch 30, respectively. Corresponding resistance values are denoted as $R_{sensor}$ and $R_{ref}$, respectively. Another circuit node 35 between the sensor resistor Rsensor and a reference resistor Rref is connected to a phase control switch 33. The phase control switch 36 can be operated by means of the reference switch signal S2.

The gas sensor arrangement 10 can be operated in two different phase: a sensor phase S and a reference phase R. In each phase R, S the signal acquisition discussed with respect to FIG. 2 can be executed. This involves the timing of signals discussed above and results in digital output signal for the sensor phase S, denoted ADC-COUNT(S), and a digital output signal for the reference phase R, denoted ADC-COUNT(R). During the sensor phase S phase control switch 33 is open, i.e. the gas sensor 11 can be represented by the sum $R_{sensor}+R_{ref}$. During the reference phase R phase control switch 33 is closed, i.e. the gas sensor 11 can be represented by the reference resistance $R_{ref}$. Thus, signal acquisition in the sensor phase S is based on a sensor current defined by $R_{sensor}+R_{ref}$ denoted as $I_R(S)$. Signal acquisition in the reference phase R is based on a sensor current defined by $R_{sensor}+R_{ref}$ denoted by $I_R(R)$.

The digital output signal ADC-COUNT for the sensor phase S is:

$$ADC-COUNT(S) = (C1S-1) + \frac{C2S\_L + C2S\_F}{C2S\_A} = \frac{I_R(S) \cdot T_{int,S}}{C_{ref} \cdot V_{ref,in}}$$

$$= \frac{V_{force} + V_{offset}}{R_{sensor} + R_{ref}} \cdot \frac{T_{int,S}}{C_{ref} \cdot (V_{ref,in} - V_{force} - V_{offset})},$$

wherein C1S is the count value C1, C2S_L is the residual time period, C2S_F the first integration period, and C2S_A the average integration period for the sensor phase, i.e. Rsensor+Rref measurement, respectively. $T_{int,s}$ denotes the integration time for the Rsensor+Rref measurement. Furthermore, $V_{force}$ is the excitation voltage, $V_{offset}$ is an offset voltage, $V_{ref,in}$ is the reference voltage at capacitor 29, and $C_{ref}$ the capacitance of capacitor Cref. For example, the offset voltage $V_{offset}$ relates to the common mode voltage VCM as $V_{force}$=VCM±$V_{offset}$.

The digital output signal ADC-COUNT for the reference phase R is:

$$ADC-COUNT(R) = (C1R-1) + \frac{C2R\_L + C2R\_F}{C2R\_A} = \frac{I_R(R) \cdot T_{int,R}}{C_{ref} \cdot V_{ref,in}}$$

$$= \frac{V_{force} + V_{offset}}{R_{ref}} \cdot \frac{T_{int,R}}{C_{ref} \cdot (V_{ref,in} - V_{force} - V_{offset})},$$

wherein C1R is the count value C1, C2R_L is the residual time period, C2R_F the first integration period, and C2R_A the average integration period for the reference phase, i.e. Rref measurement, respectively. $T_{int,R}$ denotes the integration time for the Rref measurement.

Using these two equations yields:

$$R_{sensor} = R_{ref} \cdot \left(\frac{ADC-COUNT(R) \cdot T_{int,S}}{ADC-COUNT(S) \cdot T_{int,R}} - 1\right)$$

It is apparent from this expression that the resistance of the gas sensor 11 can be determined from a ratiometric calculation. The sensor resistance $R_{sensor}$ or a change in sensor resistance $R_{sensor}-R_{ref}$ can be related to the presence of a particular gas or to a parameter indicative of a gas to be measured. For example, the gas sensor arrangement 10 can be adapted for measuring or detecting a given gas by means of appropriate calibration.

In other words the gas sensor arrangement 10 can be operated in a sensor and reference phase to determine $R_{sensor}$ and $R_{ref}$, respectively. In a certain sense this corresponds to a (1/x) compression to the entire measurement range. Hence a measurement at one end of the range may determine a resolution requirement for the gas sensor arrangement 10.

For a given configuration of $V_{force}$, $T_{int}$, $C_{ref}$, $V_{ref}$ and $R_{ref}$ values, the gas sensor arrangement has a same gain configuration. A timing for the data acquisition can be set to 10 msec for a sensor phase and a reference phase, for example. The sensor phase may last 8 msec and the reference phase 2 msec. Consider a reference resistance $R_{ref}$=1 MΩ, which is the geometric-mean for a target range of 1 kΩ to 1 GΩ.

In this case there may not be a need to use as high gain as if $R_{ref}$ where set at extremes of the target range. However, the configuration of $V_{force}$, $T_{int}$, $C_{ref}$, $V_{ref}$ and $R_{ref}$ values, can be varied to change an effective gain of the gas sensor arrangement in the sensor phase. As long as the reference phase is also done in the same setting, it can be expected that the calculation remains ratiometric and errors arising due to $V_{force}$, $T_{int}$, $C_{ref}$, $V_{ref}$ and $R_{ref}$ tend to be cancelled. Different configurations allow for extending the measurement range into more ranges such as two Ranges from 1 kΩ to 10 MΩ and 1 MΩ to 1 GΩ. For as long as $V_{force}$ remains at the same value, the gas sensor excitation is constant.

FIG. 3 shows an embodiment of a resistive gas sensor. In addition to the gas sensor depicted in FIG. 3 there may be another reference resistor RREF1 coupled between the circuit node 35 and the sensor resistor Rsensor, connected to the sensor resistor Rsensor via another circuit node 37.

Furthermore, circuit node 37 is connected to another face control switch 36.

The gas sensor arrangement 10 can be operated in a sensor phase S as discussed above. During the sensor phase S phase control switches 33 and 36 are open, i.e. the gas sensor 11 can be represented by the sum $R_{sensor}+R_{ref}+R_{ref1}$, wherein $R_{ref1}$ denotes a resistance value of the reference resistor RREF1. Furthermore, there may be two reference phases depending on whether the reference resistor Rref or Rref1 is selected by means of the phase control switches 33 or 36, respectively. During a first reference phase control switch 33 is closed, and phase control switch 36 open, i.e. the gas sensor 11 can be represented by the reference resistance $R_{ref}$. During a second reference phase control switch 33 is open, and phase control switch 36 closed, i.e. the gas sensor 11 can be represented by the reference resistance $R_{ref1}$. Signal acquisition during the phases results in digital output signals ADC-COUNT(S), ADC-COUNT(R1) and ADC-COUNT (R2). To measurement ranges can be constructed from the sensor phase combined with the first reference phase and the sensor phase combined with the second sensor phase in the way discussed with respect to FIG. 3. This way the gas sensor arrangement can be adapted to operate in 2 different measurement ranges. The concept can be extended by providing further reference resistance and phase control switches to provide for multiple measurement ranges. Parameters such as the configuration of $V_{force}$, $T_{int}$, $C_{ref}$, $V_{ref}$ and $R_{ref}$ values, can be varied to change an effective gain of the gas sensor arrangement to fit the desired measurement ranges.

The position of sensor resistor Rsensor, reference resistor Rref and/or any further reference resistors Rref1 in the series connection is interchangeable.

The invention claimed is:

1. A method for operating a gas sensor arrangement, the method comprising:
   generating a sensor current by a gas sensor;
   converting the sensor current into a digital comparator output signal in a charge balancing operation depending on a first clock signal;
   determining from the digital comparator output signal an asynchronous count comprising an integer number of counts depending on the first clock signal;
   determining from the digital comparator output signal a fractional time count depending on a second clock signal; and
   calculating from the asynchronous count and from the fractional time count a digital output signal which is indicative of the sensor current generated by the gas sensor.

2. The method according to claim 1, wherein the sensor current is integrated into one or more reference charge packages during an integration time,
   wherein a detection of a charge package determines an integration cycle,
   wherein the first clock signal is used to count a number of reference charge packages during the integration time, and
   wherein the asynchronous count is determined from the number of charge packages.

3. The method according to claim 1, wherein a time period of an integration cycle is determined from the time count by measuring a time between adjacent counts in the asynchronous count in terms of the second clock signal and/or the time count is reset when a time period has been determined.

4. The method according to claim 3, wherein a time period of a first integration cycle is determined as first integration period, and
   wherein the first integration period is determined by a first time stamp indicating a start of the first integration cycle and a second time stamp indicating a time of the first count in the asynchronous count.

5. The method according to claim 4, wherein the time period of one or more complete integration periods is determined as complete integration period, and
   wherein the complete integration period is determined by a third time stamp indicating a count in the asynchronous count and a fourth time stamp indicating a time of an adjacent count in the asynchronous count.

6. The method according to claim 5, wherein more than one complete integration periods are determined, and
   wherein an average integration period is determined from the complete integration periods.

7. The method according to claim 3, wherein
   wherein a time period after the last complete integration cycle and an end of the integration is determined as residual time period, and
   wherein the residual time period is determined by a time stamp indicating a time of the last count in the asynchronous count and a time stamp indicating the end of the integration.

8. The method according to claim 5, wherein a first count error is accounted for by calculating a first fractional count based on the first integration period and the complete integration period, and
   wherein the first fractional count is a measure of the sensor current generated during the first integration cycle.

9. The method according to claim 8, wherein a residual count error is accounted for by calculating a second fractional count based on the last integration period and the complete integration period, and
   wherein the second fractional count is a measure of the sensor current generated during the last integration cycle.

10. The method according to claim 9, wherein an average integration period is used instead of the complete integration period for calculating the first count error and/or the residual count error.

11. The method according to claim 9, wherein the digital output signal includes a sum based on the asynchronous count and the first and second fractional counts based on one or more complete integration periods and/or an average integration period.

12. The method according to claim 1, wherein the gas sensor comprises at least one reference resistor and a sensor resistor having a reference resistance $R_{ref}$ and a sensor resistance $R_{sensor}$, respectively,
   wherein, in a sensor phase, the gas sensor generates the sensor current depending on a combined resistance of the reference resistance $R_{ref}$ and the sensor resistance $R_{sensor}$, and the digital output signal of the sensor phase is indicative of the sensor current generated by the gas sensor in the sensor phase,
   wherein, in a reference phase, the gas sensor generates the sensor current depending on the reference resistance $R_{ref}$, and
   wherein the digital output signal of the reference phase is indicative of the sensor current generated by the gas sensor in the reference phase.

13. The method according to claim 12, wherein an integration time $T_{int,r}$ for the reference phase and an integration time $T_{int,s}$ for the sensor phase are chosen independently from each other.

14. A gas sensor arrangement comprising: an analog-to-digital converter arrangement comprising a sensor input for connecting a gas sensor and a result output for providing a digital comparator output signal; and a signal processing unit connected to the result output of the analog-to-digital converter arrangement,
   wherein the analog-to-digital converter arrangement is operated in a charge balancing operation depending on a first clock signal, and is adapted to convert a sensor current generated by the gas sensor into the digital comparator output signal, and
   wherein the signal processing unit is adapted to determine from the digital comparator output signal a digital output signal comprising an asynchronous count comprising an integer number of counts depending on the first clock signal and comprising a fractional time count depending on a second clock signal, wherein the digital output signal is indicative of the sensor current generated by the gas sensor.

15. The gas sensor arrangement according to claim 14, wherein the signal processing unit comprises a first counter having a first clock input connected to the result output and comprising a first reset input, a second counter comprising a second clock input and a second reset input, a logic/calculation engine comprising a calculation input connected to a first counter output of the first counter and a second counter output of the second counter,
   wherein the first counter receives the first clock signal at the first clock input and generates the asynchronous count depending on the first clock signal,
   wherein the second counter receives the second clock at the second clock input and generates the time count depending on the second clock signal,
   wherein the logic/calculation engine receives the asynchronous count and the time count and calculates the digital output signal from the asynchronous count and the time count.

16. The gas sensor arrangement according to claim 14,
   wherein the gas sensor comprises a reference resistor and a sensor resistor having at least one reference resistance $R_{ref}$ and a sensor resistance $R_{sensor}$, respectively,
   wherein, in a sensor phase, the gas sensor is arranged to generate the sensor current depending on a combined resistance of the reference resistance $R_{ref}$ and the sensor resistance $R_{sensor}$, and
   wherein, in a reference phase, the gas sensor is arranged to generate the sensor current depending on the reference resistance $R_{ref}$.

* * * * *